US 6,541,389 B1

(12) United States Patent
Kubo et al.

(10) Patent No.: US 6,541,389 B1
(45) Date of Patent: Apr. 1, 2003

(54) METHOD OF PATTERNING A THIN LAYER BY CHEMICAL ETCHING

(75) Inventors: Akira Kubo, Himeji (JP); Kiyotsugu Mizouchi, Himeji (JP); Masahiko Machida, Himeji (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/469,166

(22) Filed: Dec. 21, 1999

(30) Foreign Application Priority Data

Dec. 22, 1998 (JP) .......................... 10-364448

(51) Int. Cl.⁷ ................... H01L 21/302; H01L 21/46
(52) U.S. Cl. ................ 438/745; 438/689; 438/737
(58) Field of Search .......................... 438/597, 689, 438/705, 737, 738, 745

(56) References Cited

U.S. PATENT DOCUMENTS 4,760,351 A * 7/1988 Newell et al. .............. 331/48
5,633,175 A * 5/1997 Kikuchi et al. ............. 438/30
5,858,257 A * 1/1999 Naitoh ....................... 216/92
6,004,881 A * 12/1999 Bozada et al. ............. 438/705
6,225,150 B1 * 5/2001 Lee et al. ................... 438/153

FOREIGN PATENT DOCUMENTS

JP         04372934 A   * 12/1992
JP         09064366 A   *  3/1997

* cited by examiner

Primary Examiner—Kamand Cuneo
Assistant Examiner—Asok Kumar Sarkar
(74) Attorney, Agent, or Firm—Pillsbury Winthrop LLP

(57) ABSTRACT

A method of patterning a thin layer into a predetermined shape on the basis of a pattern layer arranged in a thin layer formed in a substrate comprises a first step of soaking the substrate in a first solution to etch off the thin layer on the basis of the pattern layer, a second step of spraying a second solution having the same composition as that of an etching solution used in a third step to wash the substrate, and a third step of soaking the substrate in a third solution to further etch the thin layer.

14 Claims, 2 Drawing Sheets

METHOD OF PATTERNING A THIN LAYER BY CHEMICAL ETCHING

BACKGROUND OF THE INVENTION

The present invention relates to a method of patterning a thin layer by wet etching. An array substrate for an active matrix type display device is constituted of a plurality of signal lines and gate wiring lines, which are arranged in a grid form on a transparent insulating substrate such as glass, and a thin film transistor (TFT) which is formed of a semiconductor film such as amorphous silicon (a-Si: H) serving as an active layer present near an intersection point at which the signal lines are crossed with the gate wiring lines.

In recent years, a method of forming a drive circuit integrally on the same array substrate, has been put in practical use, although it was used by being attached to the array substrate. As its active layer, a polycrystalline silicon (P—Si) or the like having a higher mobility than amorphous silicon is used.

In most cases, the TFT is formed into an inverted staggered type by providing a gate insulating film on gate wiring line, and then forming a semiconductor film, a source electrode and a drain electrode on the gate insulating film.

Various patterns corresponding to the gate wiring lines, gate insulating film, source electrode and drain electrode are formed in accordance with methods including wet etching and dry etching. The wet etching is widely employed in a planar display device since the structure of the device is simple and a large-area work piece can be etched uniformly with high rate.

However, in the case where the gate wiring lines of the inverted staggered type TFT is formed, the edge surface of the gate wiring lines must be processed into a taper form in order to insulate the gate wiring lines by the gate insulating film covering the gate wiring lines.

To overcome the aforementioned technical problem, Japanese Patent Application KOKAI publication Nos. 4-372934 and 9-064366 disclose a technique for forming the gate wiring lines into a taper form by use of the difference in etching rate. More specifically, the gate wiring lines are formed in a stacked-film structure consisting of an Al (aluminium) film and a Mo (molybdenum) film, etching is performed by using an acid mixture prepared by mixing phosphoric acid, acetic acid, and nitric acid in a predetermined ratio followed by adjusting the concentration of the mixture. In other words, according to the aforementioned publications, it is possible to insulate the gate electrode relatively easily without fail by forming the gate wiring line into a taper form by use of the difference in etching rate between the Al and Mo stacked films. Note that according to each of the publications, because of the wet etching, it is possible to sufficiently permeate an etching solution without being affected by the viscosity of the etching solution, with the result that a taper of a desired shape can be obtained.

However, in the manufacturing methods disclosed in the aforementioned publications, in the case where the viscosity of the etching solution is high, minute bubbles, which are generated by air entering into the etching solution at the time a substrate goes into the etching solution and generated by the reaction between the etching solution and a conductive thin layer, are not separated from the work piece to be etched on the pattern of the substrate and remain thereon.

Since the etching solution does not reach the portion on which the minute bubbles remain, Al and Mo stacked films are sometimes left without being etched.

The remaining Al and Mo stacked films not removed by etching causes short-circuit particularly in a portion densely patterned, for example, between the gate wiring lines arranged in a short distance. As a result, the yield of the product is significantly reduced.

BRIEF SUMMARY OF THE INVENTION

An object of the present invention is to provide a method of patterning a thin layer by using wet etching without a decrease in yield of a product due to the remaining pattern.

Another object of the present invention is to provide a method of patterning a thin layer in which an etching solution has a high degree of freedom.

A further object of the present invention is to provide a method of patterning a thin layer in which a large area can be uniformly etched.

The present invention provides a method of patterning a thin layer deposited on a substrate into a predetermined shape in accordance with a pattern layer disposed on the thin layer, comprising:

a first step of soaking the substrate into a first solution and etching off the thin layer in accordance with the pattern layer;

a second step of spraying a second solution onto the thin layer of the substrate, thereby the substrate is washed; and a third step of soaking the substrate into a third solution and etching off the thin layer in accordance with the pattern layer.

DETAILED DESCRIPTION OF THE INVENTION

Now, we will explain embodiments of the method of manufacturing an array substrate for use in an active matrix type display device according to the present invention, with reference to the accompanying drawings.

Figure 1A:
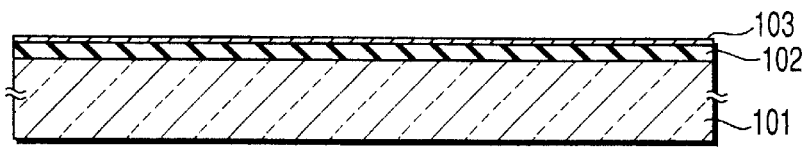
FIGS. 1A to 1E are magnified views of a single pixel including the proximity thereof, for schematically and sequentially explaining the manufacturing steps of an array substrate according to an embodiment of the present invention.
Figure 1B:
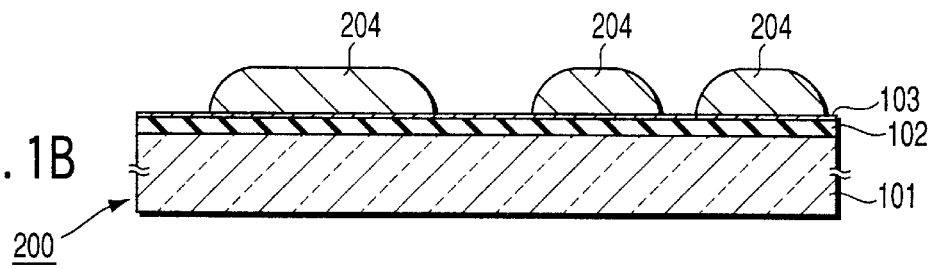
Figure 1C:
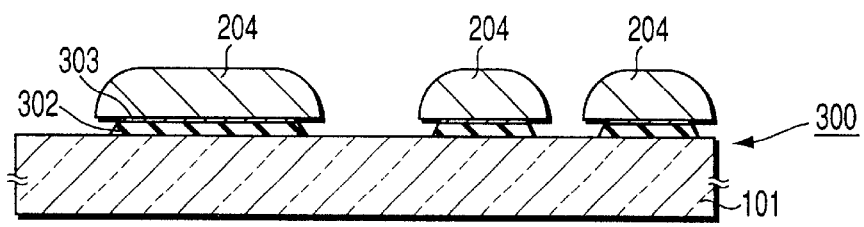
Figure 1D:
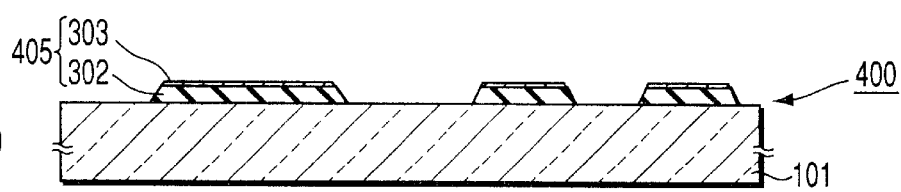
Figure 1E:
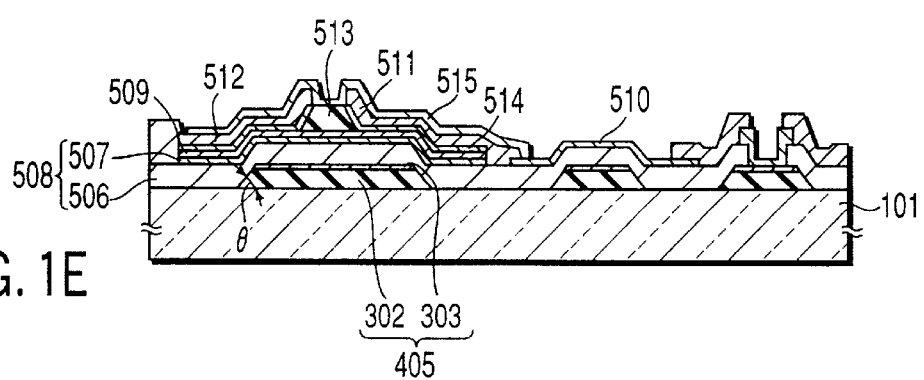

As shown in FIG. 1E, in the array substrate for the active matrix type display device manufactured by an embodiment of the manufacturing method of the present invention, signal lines (not shown) which are arranged in parallel to each other and at regular intervals and gate wiring lines 405 which are crossed in perpendicular to the signal lines. Both lines are thus arranged in a matrix form on a transparent insulating substrate 101 such as glass, and further electrically isolated by a gate insulating film 508 interposed between the signal lines and the gate wring lines. Since the signal line is electrically in contact with a drain electrode 512, FIG. 1E shows the drain electrode 512.

In the proximity of an intersection point at which the signal line and gate wiring line 405 are crossed with each other, a TFT serving as a switching element of an inverted staggered structure, and a pixel electrode 510 formed of an ITO (Indium Tin Oxide) film which is connected to each of the signal line and the gate wiring line 405 by way of TFT, are arranged as viewed from the direction which crosses perpendicularly with each of the signal line and the gate wiring line 405.

The gate wiring line 405 has a stacked structure consisting of at least two types of conductive thin films stacked on top of another, on the transparent insulating substrate 101.

A first conductive thin film 302, which is a lower layer of the gate wiring line 405, is made of, for example, an Al alloy containing Nd in an amount of 2% (hereinafter, simply referred to as "Al—Nd alloy"). The upper layer, namely, a second conductive thin film 303, is made of Mo.

On the gate wiring line 405, a semiconductor film 509 formed of an a-Si: H thin film or a p-Si thin film with the gate insulating film 508 made of, e.g., SiO or SiNx interposed between them.

On the a-Si:H film or the p-Si film, a channel protection film 513 made of SiNx or the like is formed.

On both sides of the channel protection film 513 capable of being in contact with the semiconductor film 509, a contact layer 514 is formed which is made of a low resistance semiconductor such as n$^+$ type a-Si:H containing P (phosphorus) as an impurity. Note that the contact layer 514 is electrically connected to the semiconductor film 509.

On the contact layer 514, a source electrode 511 and a drain electrode 512 and a signal line (not shown) electrically connected to the drain electrode 512, are formed. Note that the source electrode 511 is connected to the pixel electrode 510. Over the source electrode 511, the drain electrode 512 and the semiconductor film 509, a protective insulating film 515 made of SiNx or the like is formed.

The array substrate for an active matrix type display device is formed by the manufacturing steps shown in FIGS. 1A–1D.

As shown in FIG. 1A, on the transparent insulating substrate 101 formed of glass of 550 mm×650 mm area, an Al—Nd alloy (first conductive material) is formed in the form of a thin film of 300 nm in thickness and Mo (second conductive material) whose etching rate is higher than that of the Al—Nd alloy serving as the first conductive material is formed in the form of a thin film of 50 nm thick individually by sputtering, with the result that an Al—Nd alloy film and an Mo film are formed.

The first conductive thin film (Al-ND-film) 102 must have a thickness of 300 nm since a lower resistance value is required, when used as the gate wiring line whose resistance is limited.

The second conductive thin film (Mo film) 103 is used for forming a taper at a shoulder portion of the gate wiring line formed at the time etching is completed, so that it is formed in a thickness of 20 to 50 nm. If the thickness of the Mo film 103 is less than 20 nm, an acute-angled taper is resulted, with the result that the gate insulating film which will be stacked in the next step may be formed incompletely.

Subsequently, as shown in FIG. 1B, a photoresist is coated on the Mo film 103, and a desired pattern is exposed to light by the light exposure apparatus (not shown), and then developed, to form a resist pattern 204 (a substrate 200 is formed).

Figure 2:
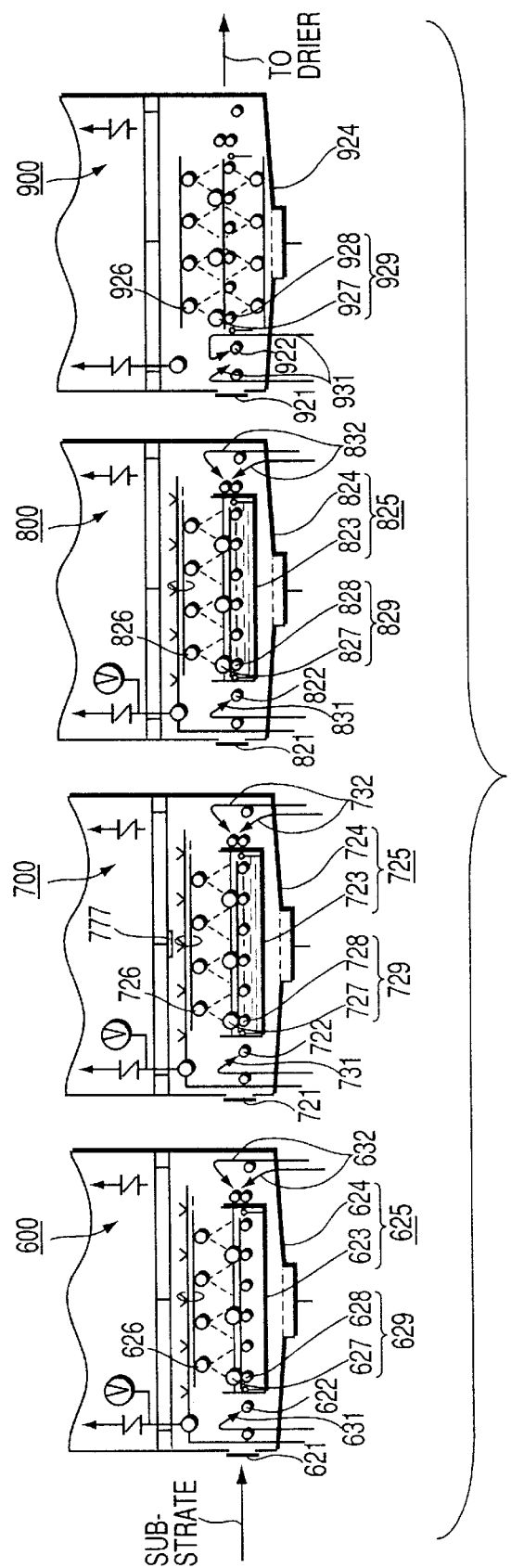
FIG. 2 is a view of a wet etching apparatus for forming the array substrate in the steps of FIGS. 1A to 1E.

Using a wet etching apparatus explained in a later step with reference to FIG. 2, etching including pretreatment is performed using the photoresist 204 as a mask. As a result, two films of the Al—Nd alloy film 302 and the Mo film 303 are etched and left in the form of a predetermined shape as shown in FIG. 1C (a substrate 300 is formed).

Thereafter, the photoresist 204 is removed to form the gate wiring line 405 (Al—Nd alloy film 302+Mo film 303) having taper-form edge portions (a substrate 400 is formed), as shown in FIG. 1D.

In the gate wiring line 405 herein, the taper is formed with an angle θ of about 30° to reduce insufficient insulation of the gate insulating film due to the stepped-form edge produced by the difference in etching rate between Mo and Al—Nd.

Subsequently, as shown in FIG. 1E, a SiO film 506 of 330 nm thick and a SiNx film 507 of 50 nm thick are formed on the gate wiring line 405. As a result, the gate insulating film 508 of a two-layered structure is deposited on the gate wiring line 405.

Subsequently, the semiconductor film 509 of 50 nm thick formed of a-Si:H and an SiNx film of 330 nm thick serving as the channel protection film 513 are sequentially formed by a CVD method in the same reaction chamber without exposing the substrate to the air.

Thereafter, the substrate is taken out from the reaction chamber, and then the channel protection film 513 is formed corresponding to the gate wiring line 405 in a self-alignment manner by a back exposure method using the gate wiring line 405 as a mask.

Subsequently, light exposure is performed using a predetermined mask pattern formed so as to correspond to the TFT region. After the exposure pattern is developed, wet etching is performed with hydrofluoric acid to remove the photoresist. As a result, the channel protection film 513 is formed in a predetermined shape (island shape).

Thereafter, the surface of the semiconductor film is treated with hydrofluoric acid to obtain a good ohmic contact, and then, a low-resistance semiconductor film is formed in a thickness of 50 nm by depositing n$^+$a-Si:H containing P in accordance with a CVD method.

Then, a channel pattern is exposed to light using a predetermined mask pattern. After the channel pattern is developed, dry etching is performed in accordance with a CDE method using a gas mixture of CF$_4$ (carbon tetrafluoride) and O$_2$ (oxygen). The photo-resist is then removed to form a semiconductor film 509 serving as a channel region.

Subsequently, ITO is deposited to a predetermined thickness by sputtering and a photoresist is coated. After the photoresist is pattern-exposed by using a predetermined mask pattern and the exposed pattern is developed, etching is performed. The remaining photoresist is removed to form the pixel electrode 510.

Thereafter, Mo, Al and Mo are sequentially deposited by sputtering in thicknesses of 25 nm, 250 nm, and 30 nm, respectively. Pattern exposure is performed by using predetermined patterns of the signal line, the source electrode 511 and the drain electrode 512, and then the patterns are developed. The three layers of Mo, Al, and Mo are processed simultaneously by the wet etching using an acid solution mixture containing phosphoric acid, nitric acid, acetic acid and water in a predetermined ratio.

The low-resistance semiconductor film remaining on the channel protection film 513 is dry-etched by a PE (Plasma Etching) method using a gas mixture of SH$_6$ (sulfur hexafluoride), HCl (hydrogen chloride), O$_2$(oxygen) and He (Herium). After the photoresist is removed, a coating film 515 of SiNx or the like is formed. As a result, the array substrate for the active matrix type display device including a thin film transistor shown in FIG. 1E is formed.

Then, referring to FIG. 2, the wet etching steps shown in FIGS. 1C and 1D will be explained more specifically. The etching apparatus is constituted of a pretreatment chamber 600 for spraying an etching solution diluted with pure water, first and second etching chambers 700, 800, and a water-washing chamber 900, all being connected to each other. Note that, in the pretreatment chamber 600, pretreatment is performed for suppressing a reaction product, which is produced from the reaction between Mo and the acid mixture, from being deposited on the substrate surface, thereby preventing a trouble presumably caused during a later etching step.

The etching apparatus has a plurality of rollers 729 for transferring the glass substrate 101 into a water vessel 725 filled with the etching solution and a plurality of shower nozzles 726 arranged so as to uniformly spray the etching solution over the substrate.

The roller 729 is repeatedly inverted along a rotation direction to move the substrate reciprocally at close intervals, so that the etching solution is delivered uniformly while the etching solution is sprayed and the substrate is soaked in the solution.

The first etching chamber 700 is equipped with an EPM (End Point Monitor) 777 for detecting that the etching is completed. By the presence of the EPM, the just etching can be performed by soaking.

The second etching chamber 800 is used for removing a remaining undesired layer and for forming the gate wiring line 405 into a predetermined taper. Due to the in-line processing thus performed by using two etching chambers, a productivity is improved.

As the etching solution, an acid solution mixture containing phosphoric acid, nitric acid, acetic acid and water in a predetermined ratio is used while maintaining at 40° C. Note that the viscosity of the etching solution is $(24\pm5)\times10^{-2}P$ (40° C.).

Under these conditions, the substrate 101 having the Al—Nd alloy film 102 and the Mo film 103 on which the photoresist 204 is formed, is transferred into an etching vessel 725 of the etching chamber 700 filled with the etching solution. Thereafter, two films of Al—Nd alloy film 302 and the Mo film 303, are wet-etched using the photoresist 204 as a mask, as shown in FIG. 1C. As a result, a predetermined shape is obtained.

More specifically, a substrate 200 formed of the Al—Nd alloy film 102 and the Mo film 103 on which a photoresist 204 is formed, is loaded into the etching apparatus from a substrate loading port 621 of the processing chamber 600. The processing chamber 600 is used for spraying the pretreatment solution, which is obtained by diluting the etching solution to a 50% concentration with pure water, onto the substrate 200. The pretreatment solution is sprayed from a shower 631 toward the substrate 200.

The nozzle of the shower 631 has a liquid spray port having a larger width than that of the substrate 200. The pretreatment solution can be uniformly delivered over the substrate 200 by passing the substrate through the shower 631.

The substrate 200 to which the pretreatment solution is supplied by the shower 631, is passed through a shutter 622 and transferred into the pretreatment chamber 600 by a transfer mechanism 629 consisting of rollers 627, 628 and then moved to a predetermined position of an inner vessel 623.

Subsequently, a dilute solution (pretreatment solution) prepared by diluting the previously explained etching solution is splayed from a shower nozzle 626 to the substrate 200, for 10 seconds. Note that it has been hitherto confirmed that if the substrate 200 is directly transferred to the etching chamber 700 in accordance with a known etching method which does not require the treatment performed in the pretreatment chamber 600, a fixed film, which cannot be removed by normal etching performed in the etching chamber 700, is formed by the reaction between a high concentration acid mixture and Mo, with the result that etching debris and slag are generated.

Then, the present inventors employed a step for fixed film spraying the dilute solution (pretreatment solution) for 10 seconds or more to suppress the generation of the etching debris, namely, the fixed film is made of Mo.

After the pretreatment is completed, the substrate 200 is transferred again by the rollers 627 and 628. Then, the dilute solution (pretreatment solution) attached to upper surface and lower surface of the substrate is removed by an air knife 632, and then transferred to the first etching chamber 700.

The substrate 200 is transferred through the loading port 721 of the first etching chamber 700 into the etching chamber. An etching solution having the same composition as that of the etching solution used in a later etching step performed in the etching vessel 723 is sprayed by the shower 731. Note that the shower 731 is constructed so as to deliver the etching solution over the entire surface of the substrate 200 in the same manner as the shower 631 of the pretreatment chamber 600 as explained before. Therefore, the substrate 200 passes first through flowing liquid by using the shower 731. As a result, the etching solution is easily applied onto the substrate uniformly in comparison with the case where the etching solution is directly sprayed only by using the shower nozzle 726 (inner vessel 723) as explained below. Therefore, Mo and the acid mixture can be reacted more uniformly within the same plane of the substrate 200. In addition, if the step of spraying the dilute solution in the pretreatment chamber 600 is employed together, the generation of the etching debris can be further reduced.

The substrate 200 having the entire surface wet with the etching solution which is sprayed through the shower 731, is passed through the shutter 722 in the first etching chamber 700 and transferred to a predetermined position of the inner vessel 723 by the transfer system 729 consisting of rollers 727, 728. The etching solution is then sprayed from the shower nozzle 726 for about 6 seconds.

Subsequently, while the etching solution is sprayed by the shower nozzle 726, the water vessel 725 is filled with the etching solution for 15 seconds. In this manner, the substrate 200 is completely soaked in the etching solution. The liquid-spraying operation is terminated at the time the substrate 200 is completely soaked in the solution, and then, first-time soak-etching is performed until the just-etching is obtained, that is, for 33 to 35 seconds.

In this embodiment, the time required for the just-etching is controlled by the EPM 777. The EPM 777 detects an amount of the refection light from the substrate when the surface of the substrate is irradiated with light. If etching is performed on the basis of the change in amount of reflection light varied depending upon the presence and absence of the thin layer to be removed, the just etching is attained. In this embodiment, since the thin layer is formed of metal films, when the underlayer is exposed by removing the thin layer, the amount of reflection light is sharply decreased. For example, if the reflection light amount reaches a predetermined light amount or less, it is determined that the just-etching is attained. Alternatively, the just etching may be determined by the EPM 777 on the basis of the change in amount of the reflection light, more specifically, a differential value thereof. Furthermore, whether or not the just-etching is attained may be determined not by the amount of the reflection light but by the amount of light passing through the substrate.

Thereafter, the substrate 200 is taken out over the liquid surface of the etching solution in the water vessel 725 and transferred toward the air knife 732 by The transfer system 729 which consists of the rollers 727 and 728. The air knife 732 plays a role in removing the etching solution attached to the upper surface and the lower surface of the substrate 200. More specifically, high-pressure air is blown out toward the substrate 200 in a predetermined direction to thereby blow out the etching solution remaining on the substrate 200.

The substrate 200 from which the etching solution has been removed by the air knife 732 (used in the first etching chamber 700) is transferred to the second etching chamber 800. Note that the second etching chamber 800 has substantially the same structure as that of the first etching chamber 700.

The substrate 200 unloaded from the first etching chamber 700 is transferred into the etching chamber 800 from a loading port 821 of the second etching chamber 800. To the substrate, the etching solution having the same composition as that used in a later etching step performed in an etching vessel 823, is sprayed by a shower 831. The shower 831 is constructed so as to deliver the etching solution over the entire surface of the substrate 200 in the same manner as in the shower 631 of the pretreatment chamber 600 as explained before. The etching solution used in the etching performed in the second etching chamber 800 has the same concentration and the same composition as those of the etching solution used in the first etching chamber 700.

Subsequently, the substrate 200 is transferred to a predetermined position of the inner vessel 823 by a transfer system 829 consisting of rollers 827 and 828. At this point, the second etching solution is sprayed from a shower nozzle 826 for 6 seconds. The time for spraying the etching solution from the shower nozzle 826 is set at the most preferable time up to 30 seconds.

Subsequently, while the water vessel 825 is filled with the etching solution for 15 seconds by spraying the etching solution continuously by the shower nozzle 826, the substrate 200 is soaked into the etching solution.

The solution-spray operation is terminated at the time the substrate 200 is completely soaked in the solution. A second-time soak-etching is performed for time which is 160 to 170% as long as the first soaking time (performed in the first etching chamber 700), that is for 53 to 60 seconds.

Since the second etching is performed in the second etching chamber 800, for example, the portion which is not etched in the first soak (performed in the first etching chamber 700) due to the presence of air bubbles, can be fully etched. Simultaneously, the etching solution can be allowed to sufficiently permeate into between the resist pattern 204 and the first conductive thin film 302. Note that the taper portion of the gate wiring line 405 can be satisfactorily formed by setting the soaking time at a value longer than the first soaking time.

The etching in the first etching chamber 700 and in the second etching chamber 800 may be repeated in multiple times by setting each of the etching time periods appropriately.

Thereafter, the substrate 200 is taken out over the surface of the etching solution in the wafer vessel 825 and transferred toward the air knife 832 by the transfer system 829 which consists of the rollers 827, 828. The substrate 200 shows the state of the substrate 300 (to which etching is performed) as shown in FIG. 1C.

Now, the substrate 300 from which excessive etching solution has been removed by the air knife 832, is transferred to the water-washing chamber 900. The substrate 300 is washed with pure water supplied to both surfaces thereof by the nozzle 926 serving as a pure water supply mechanism, and simultaneously transferred toward a dry room (not shown) by a transfer mechanism 929 consisting of rollers 927 and 928.

Subsequently, the photoresist 204 is removed to obtain a substrate 400 having a double-layered gate wiring line 405 as shown in FIG. 1D.

The gate wiring line 405 is formed into a taper with an angle $\theta$ of 30° to mitigate insufficient insulation of the gate insulating film due to the presence of the stepped edge portion. If the taper angle $\theta$ of the gate insulating film is set within 10° to 40°, it is possible to suppress occurrence of the insufficient insulation.

As explained in the above, according to the method of patterning a thin layer of the present invention, it is possible to remove minute air bubbles on the substrate completely. Therefore, a pattern can be formed without causing a short-circuit due to the etching debris of the conductive thin layer. As a result, a failure due to short-circuit between the gate wiring lines can be overcome.

Since the soak-etching is mainly employed in which the soak-etching in a liquid is performed longer than the time spraying the etching solution, the gate wiring line can be formed into a taper with an angle of the about 30° at the shoulder portion. Therefore, it is possible to suppress a failure produced between the gate wiring line and the gate insulating film.

Note that the present invention is not limited to the structure shown in the embodiment.

In the aforementioned embodiment, the case is explained where an Al—Nd alloy is used as the first conductive thin film of the gate wiring line. Other than the Al—Nd alloy, pure Al and other Al alloys may be used. Furthermore, other than Mo, any material, preferably a metal material may be used as the second conductive thin film as long as it has a different etching rate.

Note that a-Si:H is used herein as the semiconductor film, however, a polycrystalline silicon film, a fine-crystal silicon film, or the like may be used.

In this embodiment, etching is performed by using a liquid having a viscosity of $(24\pm5)\times10^{-2}$P. Even if the liquid has a viscosity of $35\times10^{-2}$P, satisfactory etching can be performed.

Furthermore, the etching liquid may be replace with a different one in every etching chamber. We have explained the case where the etching solutions having the same composition but increased concentrations in subsequent etching steps. However, when the etching solutions having a different composition are used, it is desirable that the substrate be washed before the substrate is transferred from one chamber to another chamber. When the same solution is used in the first, second, and third steps, at least one etching chamber may be prepared.

As explained in the foregoing, the method of patterning a thin layer according to the present invention, comprises a first step of soaking a substrate in a first solution and etching a thin layer on the basis of a pattern, a second step of spraying a second solution onto the thin layer of the substrate to which etching was applied in the first step, and a third step of soaking the substrate in a third solution to further etch the thin layer on the basis of the pattern. Therefore, minute air bubbles on the substrate generated in the first step are removed by the second step and thus etching can be made without fail in the third step. In this manner, the patterning can be made despite the viscosity of the etching solution, with rarely producing etching debris of the thin layer and without occurrence of the short-circuit due to etching debris.

This means that the following problems can be overcome which is associated with a known method in which the etching performed by liquid-soaking and washing with liquid spray are repeated one time for each. That is, in the case where the spray is performed after the liquid soaking, although minute air bubbles on the substrate are removed, etching failure occurs in the portion the air bubbles have been present. In contrast, in the case in which the treatments are performed in a reverse order, the short circuit is caused between the wiring lines by the presence of the minute air bubbles remaining on the substrate and the gate wiring line is not formed into a taper form.

In this application, the second liquid is capable of etching the thin film. Therefore, it is possible to perform patterning satisfactorily without inhibiting the third liquid from permeating in a step later on. Particularly, since the etching time of each of the first step and the third step is set longer than that of the second step, in other words, wet etching performed by soaking in a liquid is mainly employed, the liquid can be permeated into a space between the photoresist and the first conductive thin film. As a result, the gate wiring lines can be sufficiently formed into a taper, so that the interlayer failure is prevented.

Furthermore, in the case where the patterning method of the present invention is applied to the formation of the gate wiring line of the thin film transistor, if the thin layer is constituted of the first and second conductive thin films both being different in etching rate, it is possible to process the gate wiring lines into a taper form.

As explained in the foregoing, according to a method of patterning a thin layer, it is possible to sufficiently prevent a defect of short circuit due to the etching debris of the thin layer and to greatly improve a yield of a product. Since the soak-etching is dominantly used, the viscosity of the liquid can be selected with a great degree of freedom. It follows that the thin layer can be processed into a taper form, preventing a decrease in yield of a product caused by interlayer failure.

What is claimed is:

1. A method of patterning a thin layer deposited on a substrate into a predetermined shape in accordance with a pattern layer disposed on the thin layer, comprising:

a first step of soaking the substrate in a first solution and etching the thin layer in accordance with the pattern layer;

a second step of spraying a second solution onto the thin layer of the substrate, thereby washing the substrate; and a third step of soaking the substrate in a third solution and etching the thin layer in accordance with the pattern layer after the second step;

wherein the first and third solutions are same in composition and concentration.

2. The method of patterning a thin layer according to claim 1, wherein the thin layer includes a first thin film and a second thin film arranged on the first thin film.

3. The method of patterning a thin layer according to claim 2, wherein at least one of said first and second thin films is a conductive thin film.

4. The method of patterning a thin layer according to claim 3, further comprising the steps, after the third step, of:

depositing a gate insulating film covering the etched thin layer;

forming a semiconductor film the thin layer via the gate insulating film; and forming a source electrode and a drain electrode to be electrically connected to the semiconductor film.

5. The method of patterning a thin layer according to claim 4, wherein, in the second step, spray is performed within 30 seconds.

6. The method of patterning a thin layer according to claim 2, further comprising the steps, after the third step, of:

depositing a gate insulating film covering the etched thin layer;

forming a semiconductor film on the thin layer via the gate insulating film; and forming a source electrode and a drain electrode to be electrically connected to the semiconductor film.

7. The method of patterning a thin layer according to claim 6, wherein, in the second step, spray is performed within 30 seconds.

8. The method of patterning a thin layer according to claim 1, wherein the second solution is an etching solution for etching the thin layer.

9. The method of patterning a thin layer according to claim 1, wherein the first step to third step is repeated as a unit multiple time if necessary.

10. The method of patterning a thin layer according to claim 1, wherein a taper angle of the thin layer is set within a range of 10 to 40°.

11. The method of patterning a thin layer according to claim 1, further comprising steps, after the third step, of:

depositing a gate insulating film covering the etched thin layer;

forming a semiconductor film on the thin layer via the gate insulating film; and forming a source electrode and a drain electrode to be electrically connected to the semiconductor film.

12. The method according to claim 11, wherein the substrate is an array substrate for use in a display device.

13. A method of patterning a thin layer deposited on a substrate into a predetermined shape in accordance with a pattern layer disposed on the thin layer, comprising:

soaking the substrate in an initial solution having a composition and concentration, and etching the thin layer in accordance with the pattern layer;

spraying an etching solution onto the thin layer of the substrate for etching and washing the substrate; and soaking the substrate in another solution having the same in composition and concentration of the initial solution and etching the thin layer in accordance with the pattern layer after spraying.

14. A method of patterning a thin layer deposited on a substrate into a predetermined shape in accordance with a pattern layer disposed on the thin layer, comprising:

soaking the substrate in a first solution and etching the thin layer in accordance with the pattern layer;

spraying a second solution onto the thin layer of the substrate, thereby washing the substrate, the second solution being an etching solution; and soaking the substrate in a third solution and etching the thin layer in accordance with the pattern layer after the second step.

* * * * *